United States Patent
Upadhyaya et al.

(10) Patent No.: US 11,555,828 B2
(45) Date of Patent: Jan. 17, 2023

(54) TESTING PROBE SYSTEM FOR TESTING SEMICONDUCTOR DIE, MULTI-CHANNEL DIE HAVING SHARED PADS, AND RELATED SYSTEMS AND METHODS

(71) Applicant: Micron Technology, Inc., Boise, ID (US)

(72) Inventors: Vikrant Upadhyaya, Kanagawa (JP); Tsuneo Abe, Kanagawa (JP)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 16/922,458

(22) Filed: Jul. 7, 2020

(65) Prior Publication Data

US 2022/0011344 A1   Jan. 13, 2022

(51) Int. Cl.
*G01R 1/067*  (2006.01)
*G01R 31/3185*  (2006.01)
*G01R 31/26*  (2020.01)

(52) U.S. Cl.
CPC .............. *G01R 1/067* (2013.01); *G01R 31/26* (2013.01); *G01R 31/318511* (2013.01)

(58) Field of Classification Search
CPC . G01R 1/067; G01R 31/318511; G01R 31/26
See application file for complete search history.

(56) References Cited

U.S. PATENT DOCUMENTS

| | | | | |
|---|---|---|---|---|
| 2003/0098457 A1* | 5/2003 | Whetsel | ......... | G01R 31/318536 257/48 |
| 2006/0076690 A1* | 4/2006 | Khandros | ............... | H01L 24/49 257/777 |
| 2006/0214189 A1* | 9/2006 | Chen | ................. | H01L 21/76838 257/691 |
| 2008/0175080 A1* | 7/2008 | Kim | .................... | G11C 29/1201 365/201 |
| 2016/0245859 A1* | 8/2016 | Geerlings | .......... | G01R 31/2884 |
| 2017/0110160 A1* | 4/2017 | Seo | .......................... | H01L 24/06 |
| 2020/0371157 A1* | 11/2020 | Choi | .................... | G01R 31/2884 |

* cited by examiner

*Primary Examiner* — Feba Pothen
(74) *Attorney, Agent, or Firm* — TraskBritt (57) ABSTRACT

A testing probe system includes probes configured to contact shared probe pads of multi-channel die of a wafer; and a controller configured to generate testing patterns and receive signals from the multi-channel die of the wafer. The controller is configured to contact a probe of the probes with a shared probe pad of the multi-channel die, select a first channel of the multi-channel die to test, select at least one test mode for testing the first channel, stimulate at least the first channel during a single contact period, acquiring a first output of the first channel during the single contact period, select a second channel of the multi-channel die to test, select at least one test mode for testing the second channel, stimulate at least the second channel during the single contact period, and acquire a second output of the first channel during the single contact period.

25 Claims, 7 Drawing Sheets

| Command | Command Pins | CA Pins (6) | | | | | | Clock Edge |
|---|---|---|---|---|---|---|---|---|
| | CS | CA0 | CA1 | CA2 | CA3 | CA4 | CA5 | |
| Read-1 | High | Low | High | Low | Low | Low | BL | First rising edge |
| | Low | BA0 | BA1 | BA2 | V | C9 | AP | Second rising edge |
| Write-1 | High | Low | Low | High | Low | Low | BL | First rising edge |
| | Low | BA0 | BA1 | BA2 | V | C9 | AP | Second rising edge |
| Read-2/Write-2 | High | Low | High | Low | Low | High | C8 | First rising edge |
| | Low | C2 | C3 | C4 | C5 | C6 | C7 | Second rising edge |

FIG. 4

| Configuration | Pin Value | First Channel | Second Channel |
|---|---|---|---|
| 2 channels | 0 | Selected | Unselected |
| 2 channels | 1 | Unselected | Selected |
| 1 channel | X | Ignored | Ignored |

*FIG. 5*

| TM | Operation Code | Ch A Input | Ch A Output | Ch B Input | Ch B Output | Description |
|---|---|---|---|---|---|---|
| 1 | Operation Code 1 | 0 | X | 0 | X | *Stimulating (e.g., firing) both channels. No output from either channel* |
| 2 | Operation Code 2 | 0 | 0 | 0 | X | *Stimulating (e.g., firing) both channels. Output only from first channel* |
| 3 | Operation Code 3 | 0 | X | 0 | 0 | *Stimulating (e.g., firing) both channels. Output only from second channel* |
| 4 | Operation Code 4 | 0 | 0 | X | X | *Stimulating (e.g., firing) only the first channel. Output only from first channel* |
| 5 | Operation Code 5 | X | X | 0 | 0 | *Stimulating (e.g., firing) only the second channel. Output only from second channel* |

TESTING PROBE SYSTEM FOR TESTING SEMICONDUCTOR DIE, MULTI-CHANNEL DIE HAVING SHARED PADS, AND RELATED SYSTEMS AND METHODS

FIELD

Embodiments of the disclosure relate generally to a testing probe system for testing semiconductor die, methods of testing multiple channels of a given multi-channel die via a single contact period, and related systems and methods.

BACKGROUND

Semiconductor die are conventionally made in large area wafers such that hundreds or thousands of identical individual die are simultaneously made. Such die may comprise diodes, transistors, metal-oxide semiconductor field-effect transistors, insulated-gate bipolar transistors, etc. After being formed, the die of the wafer may be tested for certain characteristics via a testing apparatus (typically called "wafer probe" or "probe" test). Typical die testing includes optical testing, or electrical testing by contacting the dies with probe needles. Die which fail the probe test for any reason are normally marked for removal.

Die which pass the probe test in the wafer are often damaged, particularly on the bond pads and under bump metallization (UBM) contacted by the probe needles, when electrically tested. Furthermore, oftentimes, via the optical testing, die which have only minor cosmetic damage are marked for removal. Due to the testing limitations and inaccuracies discussed above during wafer probing, some die pass the wafer probe test and are treated as "good die" when, in fact, the die are defective. Conversely, some die fail wafer probe test and are treated as bad die when, in fact, the die are "good die." As a result, good die may be discarded and improperly marked "good" die are frequently assembled in package form and defects discovered only when the packaged device is fully tested.

Furthermore, semiconductor die supporting multi-channel configurations within a same semiconductor die present several testing probe evaluation challenges. For example, when semiconductor die operate in a two-channel configuration, an effective count of the number of evaluations would be doubled corresponding to the doubled channel. As a result, when utilizing conventional testing probe systems, twice as a many contact periods (e.g., "touch downs") between probes and a given semiconductor die is required. Accordingly, twice as much time is required to test die having two-channel configurations, which can lead to reduced overall die production and/or significant testing system modifications.

DETAILED DESCRIPTION

The illustrations presented herein are not actual views of any particular testing probe device or multi-channel die but are merely idealized representations employed to describe example embodiments of the disclosure. The following description provides specific details of embodiments of the disclosure in order to provide a thorough description thereof. However, a person of ordinary skill in the art will understand that the embodiments of the disclosure may be practiced without employing many such specific details. Indeed, the embodiments of the disclosure may be practiced in conjunction with conventional techniques employed in the industry. In addition, the description provided below does not include all elements to form a complete structure or assembly. Only those process acts and structures necessary to understand the embodiments of the disclosure are described in detail below. Additional conventional acts and structures may be used. Also note, any drawings accompanying the application are for illustrative purposes only, and are thus not drawn to scale. Additionally, elements common between figures may have corresponding numerical designations.

As used herein, the terms "comprising," "including," and grammatical equivalents thereof are inclusive or open-ended terms that do not exclude additional, un-recited elements or method steps, but also include the more restrictive terms "consisting of," "consisting essentially of," and grammatical equivalents thereof.

As used herein, the term "may" with respect to a material, structure, feature, or method act indicates that such is contemplated for use in implementation of an embodiment of the disclosure, and such term is used in preference to the more restrictive term "is" so as to avoid any implication that other compatible materials, structures, features, and methods usable in combination therewith should or must be excluded.

As used herein, the term "configured" refers to a size, shape, material composition, orientation, and arrangement of one or more of at least one structure and at least one apparatus facilitating operation of one or more of the structure and the apparatus in a predetermined way.

As used herein, the terms "vertical," "longitudinal," "horizontal," and "lateral" are in reference to a major plane of a structure and are not necessarily defined by earth's gravitational field. A "horizontal" or "lateral" direction is a direction that is substantially parallel to the major plane of the structure, while a "vertical" or "longitudinal" direction is a direction that is substantially perpendicular to the major plane of the structure. The major plane of the structure is defined by a surface of the structure having a relatively large area compared to other surfaces of the structure. With reference to the figures, a "horizontal" or "lateral" direction may be perpendicular to an indicated "Z" axis, and may be parallel to an indicated "X" axis and/or parallel to an indicated "Y" axis; and a "vertical" or "longitudinal" direction may be parallel to an indicated "Z" axis, may be perpendicular to an indicated "X" axis, and may be perpendicular to an indicated "Y" axis.

As used herein, the singular forms following "a," "an," and "the" are intended to include the plural forms as well, unless the context clearly indicates otherwise.

As used herein, the term "and/or" includes any and all combinations of one or more of the associated listed items.

As used herein, the term "substantially" in reference to a given parameter, property, or condition means and includes to a degree that one of ordinary skill in the art would understand that the given parameter, property, or condition is met with a degree of variance, such as within acceptable manufacturing tolerances. By way of example, depending on the particular parameter, property, or condition that is substantially met, the parameter, property, or condition may be at least 90.0% met, at least 95.0% met, at least 99.0% met, or even at least 99.9% met.

As used herein the term "wafer" means and includes not only conventional, substantially circular wafers of semiconductor material, but also bulk substrates comprising a layer of semiconductor material residing on an underlying supporting substrate of, for example, glass or ceramic.

Embodiments of the disclosure include a testing probe system and method for testing and evaluating multiple channels of a multi-channel die (e.g., a die having a current multi-channel configuration) during a single continuous contact period ("touch-down") between a probe of the testing probe system and a probe pad of the multi-channel die. The multi-channel die may include shared probe pads that are operably coupled to each channel of the multi-channel die. For instance, the shared probe pads may include both command pads and shared data pads that are shared between the channels of the multi-channel die. In some embodiments, the shared probe pads may be formed in a center region of an upper surface of the multi-channel die. Furthermore, testing the multiple channels of the multi-channel die may be controlled through specific method acts as described herein.

The testing probe system, the multi-channel die, and the methods of testing disclosed herein may provide advantages over conventional testing probe systems, dies, and testing methods. For instance, because the multi-channel die includes shared probe pads, and because the testing probe system can test multiple channels of the multi-channel die during a single contact period ("touch-down") with the shared probe pads, the testing probe system and the multi-channel die of the disclosure may reduce an amount of time required to test multiple channels of a given die in comparison to conventional multi-channel die and testing probe systems, which require separate contact periods ("touch-downs") for testing each channel of the multi-channel die. For instance, the combination of the testing probe system and the multi-channel die of the disclosure may reduce an amount of time required to test multiple channels of a multi-channel die by at least half.

By reducing the amount of time required to test both the first and second channels of the multi-channel die, the testing probe system and multi-channel die of the disclosure may reduce an amount of time required to test an entire wafer, which may decrease production time and may increase overall production. Increasing overall production may lead to increased sales and revenue.

Furthermore, reducing a number of contact periods between the probes of the testing probe system and the shared probe pads of the multi-channel die, the testing probe system and the multi-channel die of the disclosure may reduce a likelihood that the multi-channel die and other multi-channel die of a wafer are damaged during testing processes. Reducing the likelihood that dies are damaged during testing may increase a yield of good die per wafer, which may increase efficiency, sales, and revenue.

Moreover, the combination of the testing probe system and the multi-channel die may be implemented without requiring physical modification of a given testing probe system (e.g., a conventional testing probe system). For instance, conventional needle probes and conventional needle probe orientations (e.g., probe cards) may be utilized because the orientation of the shared probe pads may be determined/formed based on a pattern of conventional needles probes of a given testing probe system. Furthermore, additional needle probes beyond conventional numbers are unnecessary to implement methods described herein.

Figure 1:
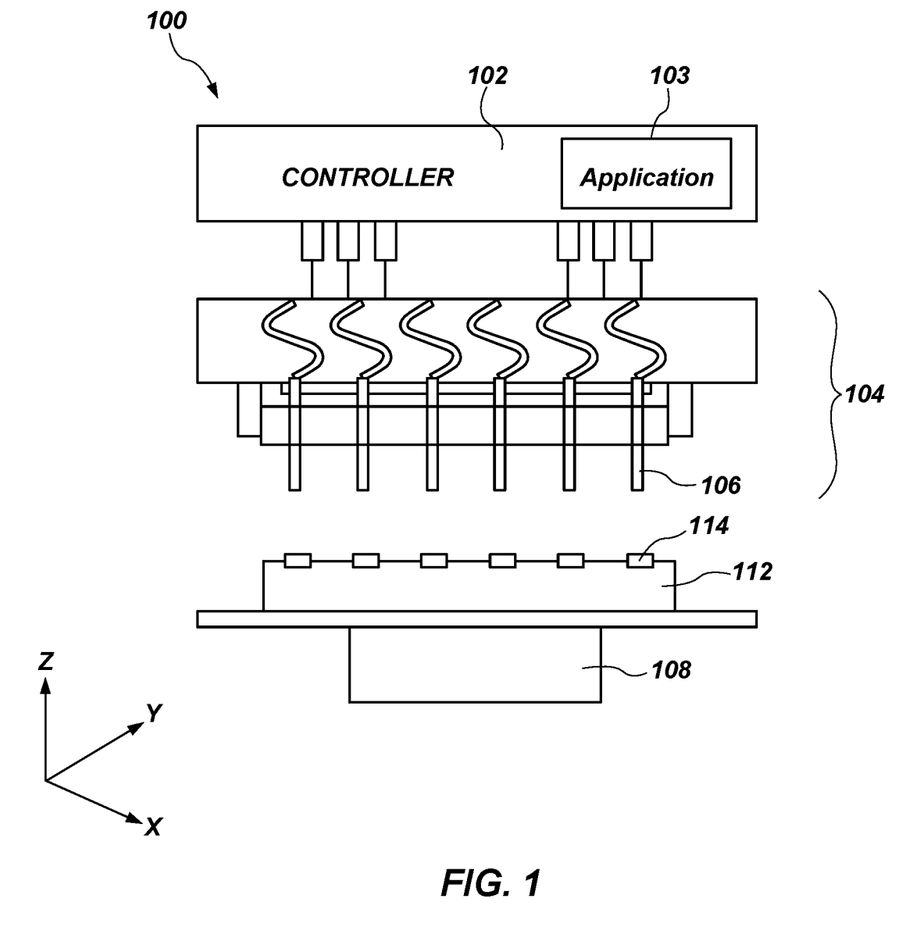
FIG. 1 shows a schematic view of a testing probe system according to one or more embodiments of the disclosure.

FIG. 1 shows a schematic diagram of a testing probe system 100 according to one or more embodiments of the disclosure. As is discussed in greater detail below, the testing probe system 100 may be utilized to test, in real time, either singulated or unsingulated die of a wafer. Furthermore, the testing probe system 100 may test multiple channels of a given multi-channel die with a single contact period (e.g., a single physical contact) ("touch down") on a probe pad of the given die. As is described in greater detail below, the testing probe system 100 may be utilized to identify known good die (hereinafter "KGD") through testing and evaluating die of wafer. As used herein, the term "known good die" refer to a die that, based on test results, meets quality parameters defined based on predetermined use(s) of the die. For example, the term "known good die" or "KGD" can refer to a die that is at least substantially free of defects that influence performance of the die (e.g., defects that could render a chip within a multi-chip package useless).

The testing probe system 100 may include a controller 102, a probe card 104 having a multiple probe needles 106, and a chuck 108. The controller 102 may be electrically connectable to the probe card 104. The probe needles 106 may be arranged on a side of the probe card 104 for electrical connection (e.g., contact) to respective conductors (e.g., pads) of a wafer 112 supported on the chuck 108. In some embodiments, the testing probe system 100 may not include a probe card 104 and may include any other conventional microscopic contacts for probing dies of a wafer.

The controller 102 may be configured to generate or route test signals and patterns to the probe needles 106 via the probe card 104. For example, the controller 102 may include a testing application 103 for generating test signals and test patterns for testing die of a wafer and for acquiring (e.g., receiving) return output (e.g., signals and/or data) from the die during testing procedures. In some embodiments, the application 103 may include at least portions of conventional testing applications. As a non-limiting example, the application 103 may include at least a portion of probe card operation software, which may be modified and/or augmented to perform one or more processes described herein. More particularly, the controller 102 may generate test signals and/or receive test signals from a testing circuit and then transmit the test signals to the probe needles 106 via the probe card 104.

The probe needles 106 may be arranged in an array and may be of any configuration suitable for probing semiconductor wafers or dies. Furthermore, the probe card 104 may include any conventional probe card.

The chuck 108 may support a wafer, for example, wafer 112 or a dummy wafer, and may enable relative movements between the supported wafer 112 and the probe needles 106. Specifically, the chuck 108 may be configured to move in the X and Y directions (as schematically shown in FIG. 1) to align the wafer 112 with the probe needles 106, and also in the Z direction to move the wafer 112 toward and away from the probe needles 106 for causing intended electrical contacts between the probe needles 106 and the wafer 112. As a non-limiting example, the chuck 108 may include any conventional chuck.

The wafer 112 may include multiple probe pads 114 formed on an upper surface of the wafer 112 (e.g., an upper surface of a semiconductor material). The probe pads 114 may include, but are not limited to, conductive bodies, conductive traces (patterns), bonding pads, bumps, other test pads, etc. The probe pads 114 may be arranged and formed for testing purposes (e.g., to match an arrangement of probe needles 106). For instance, each probe pad of the multiple probe pads 114 may be formed and arranged to be brought into contact with at least one of the probe needles 106 for receiving test signals and provide output signals for testing an associated die of the wafer 112. As is described in greater detail below in regard to FIG. 2, one or more of the probe pads 114 may include a shared probe pad that is shared between multiple channels of a multi-channel die. In other words, the one or more of the probe pads 114 may include a shared probe pad that is operably coupled to multiple channels of the multi-channel die (e.g., to portions of the multi-channel die correlating to different channels of the multi-channel die).

In some embodiments, the wafer 112 may include additional electronic components formed therein and/or thereon. The electronic components include, for example, but are not limited to, transistors (e.g., metal oxide semiconductor field effect transistors (MOSFET)), complementary metal oxide semiconductor (CMOS) transistors, bipolar junction transistors (BJT), high voltage transistors, high frequency transistors, p-channel and/or n-channel field effect transistors (PFETs/NFETs etc.,); resistors; diodes; capacitors; inductors; fuses; and other suitable elements. The electronic components may be interconnected to form integrated circuit devices, such as a logic device, memory device (e.g., DRAM), RF device, input/output (I/O) device, system-on-chip (SoC) device, combinations thereof, and other suitable types of devices. In one or more embodiments, the wafer 112 may include three-dimensional integrated circuits (3D ICs) as are known in the art.

Additionally, as mentioned above, the wafer 112 may include one or more multi-channel die. For example, the wafer 112 may include one or more multi-channel semiconductor memory devices having multiple stacked channel memories. In other words, the multi-channel die may be capable of operating in a two-channel configuration and supporting independent functionality of at least two channels. Accordingly, each die (e.g., semiconductor device) of the wafer 112 may include at least two portions, with a first portion accessed through a first respective channel and a second portion accessed through a second respective channel. Some types of accesses that may be performed through the first or second channels include, for example, read and write access requests. In some embodiments, information (e.g., read/write access information such as a read/write command, address, and/or data) may be transmitted to and/or received from the first portion through the first channel without passing through the second region, and information (e.g., read/write access information such as a read/write command, address, and/or data) may be transmitted to and/or received from the second portion through the second channel without passing the first portion.

In some embodiments, the first channel (e.g., Ch-A) is an exclusive channel for the first portion of the multi-channel die, and the second channel (e.g., Ch-B) is an exclusive channel for the second portion of the multi-channel die. The first and second channels (e.g., Ch-A and Ch-B) may be operably connected to a memory controller that communicates with a host such as a microprocessor. When a data read request or a data write request is received from the host, the memory controller applies a read command or a write command to the die (e.g., semiconductor device) through the first channel and/or the second channel. The first channel and second channel may be independent of each other.

The controller 102 of the testing probe system 100 may represent various types of computing devices with which operators (e.g., testers) can interact. For example, the controller 102 may include any computing device. In some embodiments, the controller 102 may be native to the testing probe system 100. For instance, the controller 102 may include a portion of a probe head and/or may be internal to the testing probe system 100. In other embodiments, the controller 102 may be separate and distinct from other portions of the testing probe system 100 and may be operably coupled to the other portions of the testing probe system 100. For example, the controller 102 may include a desktop computer and/or server. In additional embodiments, the controller 102 may include a mobile device (e.g., a cell phone, a smartphone, a PDA, a tablet, a laptop, etc.). The controller 102 is described in further detail in regard to FIG. 7.

During a wafer testing process, the wafer 112 is supported on the chuck 108. A controller (e.g., controller 102 or another controller) moves the chuck 108, in the X and Y directions, relative to the probe needles 106 to align the conductive pads to be tested of the wafer 112 with the probe needles 106. The controller 102 then causes the chuck 108 to move, in the Z direction, toward the probe needles 106 and causing contact between the probe needles 106 and respective probe pads of die to be tested of the wafer 112. As is discussed in greater detail below in regard to FIGS. 2-6, test signals are transmitted from the controller 102, to the probe needles 106, and then to the probe pads 114 for testing die of the wafer 112. In some embodiments, automated test equipment (ATE) may be utilized to generate test signals to be sent to the testing probe system 100 via the controller 102.

Referring still to FIG. 1, in some embodiments, the testing probe system 100 may be utilized to test wafers (e.g., wafer 112) supported by film frames and/or carriers such as foam and paper carriers. Furthermore, the testing probe system 100 may enable full wafer testing pre- or post-die singulation (i.e., cutting a wafer containing multiple integrated circuits into individual dies each comprising self-contained integrated circuits). As a result, the testing probe system 100 may enable wafers to be tested at an end of a processing line (e.g., a processing line for fabricating the die) and immediately prior to a pick and place operation to dispose die on higher-level packaging or in a stack with other die.

Figure 2:
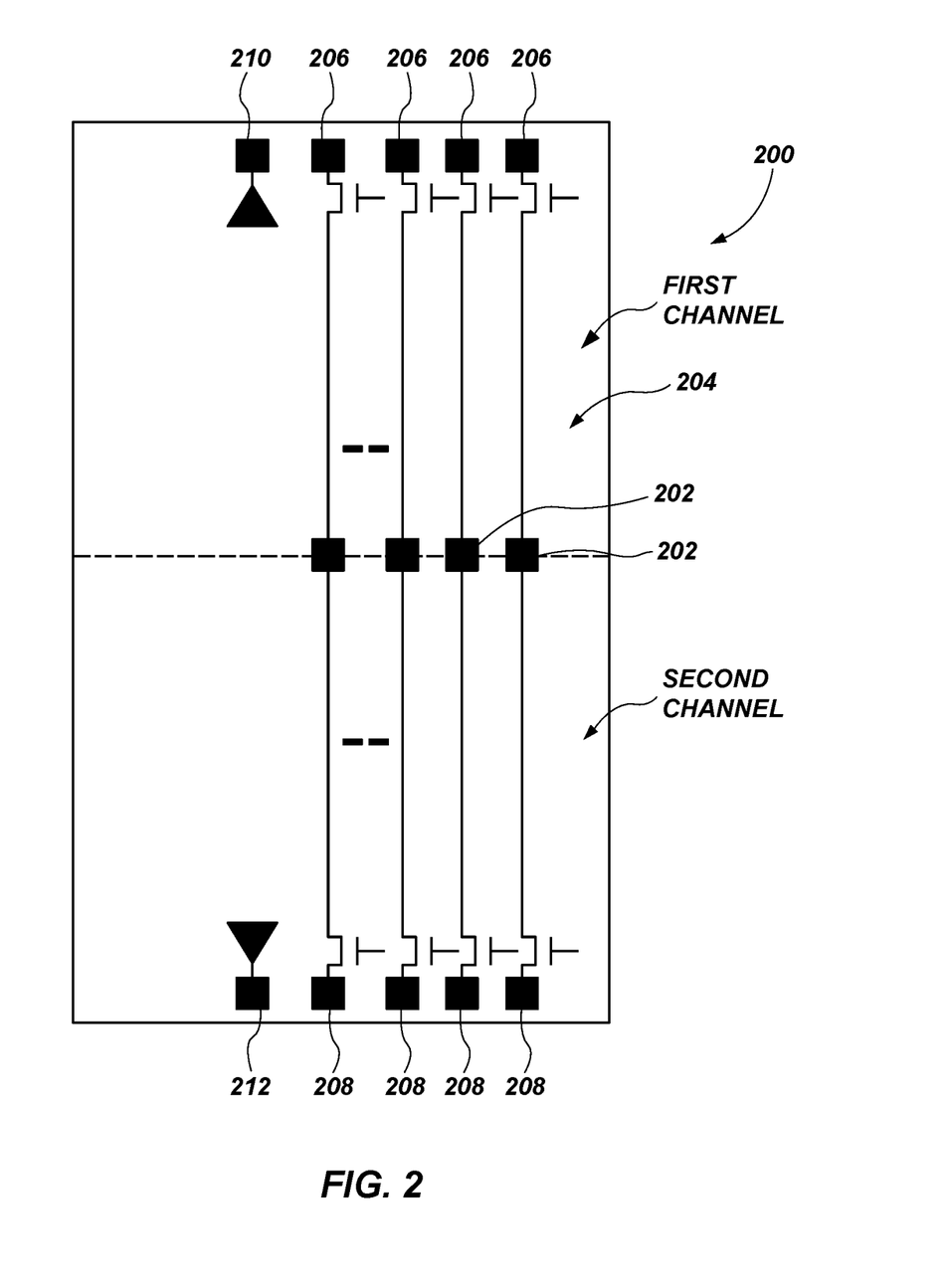
FIG. 2 shows a schematic view of a multi-channel die according to one or more embodiments of the disclosure.

FIG. 2 is a top view of a multi-channel die 200 (e.g., a multi-channel semiconductor die) having shared probe pads 202 according to one or more embodiments of the disclosure.

In some embodiments, the multi-channel die 200 may include shared probe pads 202 that are shared by two or more portions of the multi-channel die 200 associated with respective channels of the multi-channel die 200. For example, the shared probe pads 202 may be operably coupled (e.g., electrically coupled) to each of the two or more channels of the multi-channel die 200. In one or more embodiments, both command pads and data pads are shared between the two or more channels of the multi-channel die 200. To facilitate description of the multi-channel die 200 of the disclosure, the multi-channel die 200 will be described as having two channels and two respective portions; however, the multi-channel die 200 may have any conventional number of channels and portions. Furthermore, as discussed above in regard to FIG. 1, the multi-channel die 200 may include circuitry associated with each channel.

In one or more embodiments, the multi-channel die 200 may further include native command pads 206, 208 and data pads 210, 212 (e.g., conventional command and data pads) for each of the first and second channels of the multi-channel die 200. For example, the shared probe pads 202 may be formed in addition to the native command pads 206, 208 and data pads 210, 212 of the first and second channels of the multi-channel die 200. In some embodiments, one or more of the shared probe pads 202 may be electrically coupled to one or more of the native pads.

In some embodiments, the shared probe pads 202 may be formed on an upper surface 204 of a semiconductor material and in a center region of the multi-channel die 200. For example, the shared probe pads 202 may be formed on an upper surface 204 and may be generally centered between two opposing lateral sides of the multi-channel die 200. Furthermore, the native command pads 206, 208 and data pads 210, 212 of the first and second channels of the multi-channel die 200 may be formed proximate an outer peripheral edge of the upper surface 204 of the multi-channel die 200. In some embodiments, the shared probe pads 202 may be aligned relative to one another linearly on the upper surface 204 of the multi-channel die 200 and may at least substantially match an orientation of the native command pads 206, 208 and/or data pads 210, 212 of the first and/or second channels of the multi-channel die 200. As a result, conventional orientations of probe needles 106 of the testing probe system 100 may be utilized to test the multi-channel die 200 without alteration of the orientations of the probe needles 106 of the testing probe system 100. For instance, the shared probe pads 202 may be formed in any arrangement to match an arrangement of the probe needles 106 of the testing probe system 100.

Figure 3:
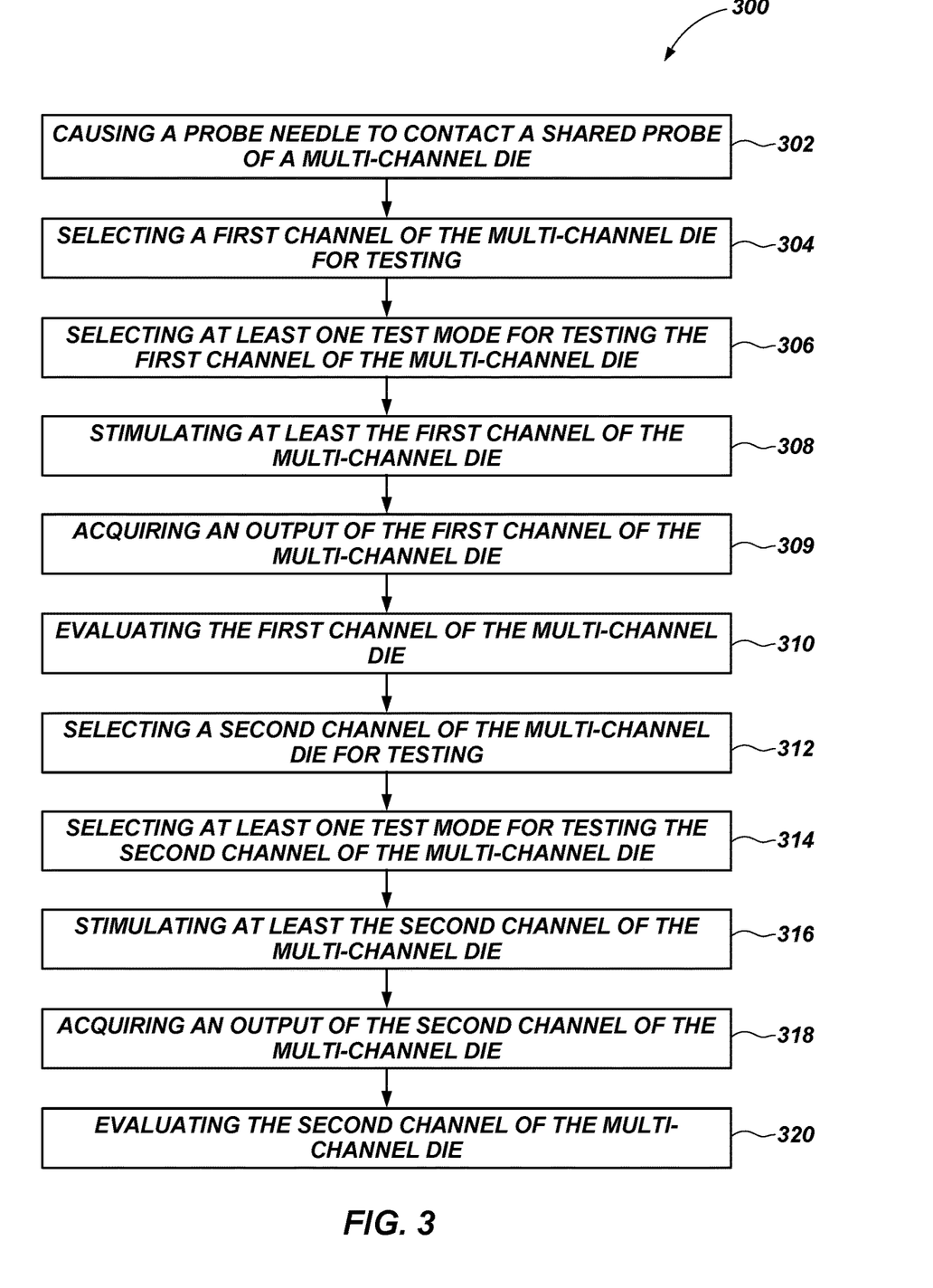
FIG. 3 shows a schematic flow diagram of a method of testing multi-channel die according to one or more embodiments of the disclosure.

FIG. 3 shows a schematic flow chart of a method 300 of testing a multi-channel die 200 (e.g., a die in a multi-channel configuration). The description of FIG. 3 includes references to testing probe system 100 of FIG. 1 and the multi-channel die 200 of FIG. 2. As noted above, the term "multi-channel die" may refer to a die configured to operate in a multi-channel configuration. However, it is understood that the same die may be configured to operate in a single-channel mode in alternative scenarios. The method 300 includes testing the multi-channel die 200 for functional defects by applying test patterns to the multi-channel die 200. For example, the method 300 may include evaluating the multi-channel die 200 to determine whether the multi-channel die 200 is a good die (e.g., a known good die). The evaluation may later be used and/or referenced in sorting and picking processes.

The method 300 may include causing a probe needle 106 to contact a shared probe pad 202 of the multi-channel die 200, as shown in act 302 of FIG. 3. For example, the controller 102 may cause the probe needle 106 of the testing probe system 100 to initiate a contact period (a "touch down") on a shared probe pad 202 of the multi-channel die 200 via conventional methods. As a non-limiting example, the controller 102 may cause the chuck 108 and/or the probe card 104 (via a probe head) to move in one or more of the X, Y, and Z directions to align a probe needle 106 with a shared probe pad 202 and to contact the shared probe pad 202 of the multi-channel die 200. Furthermore, the controller 102 may cause an electrical connection to be established between the probe needle 106 and the shared probe pad 202 via conventional methods. The shared probe pad 202 may be operably coupled to at least two channels of the multi-channel die 200 via any of the manners described above in regard to FIGS. 1 and 2.

Figure 4:
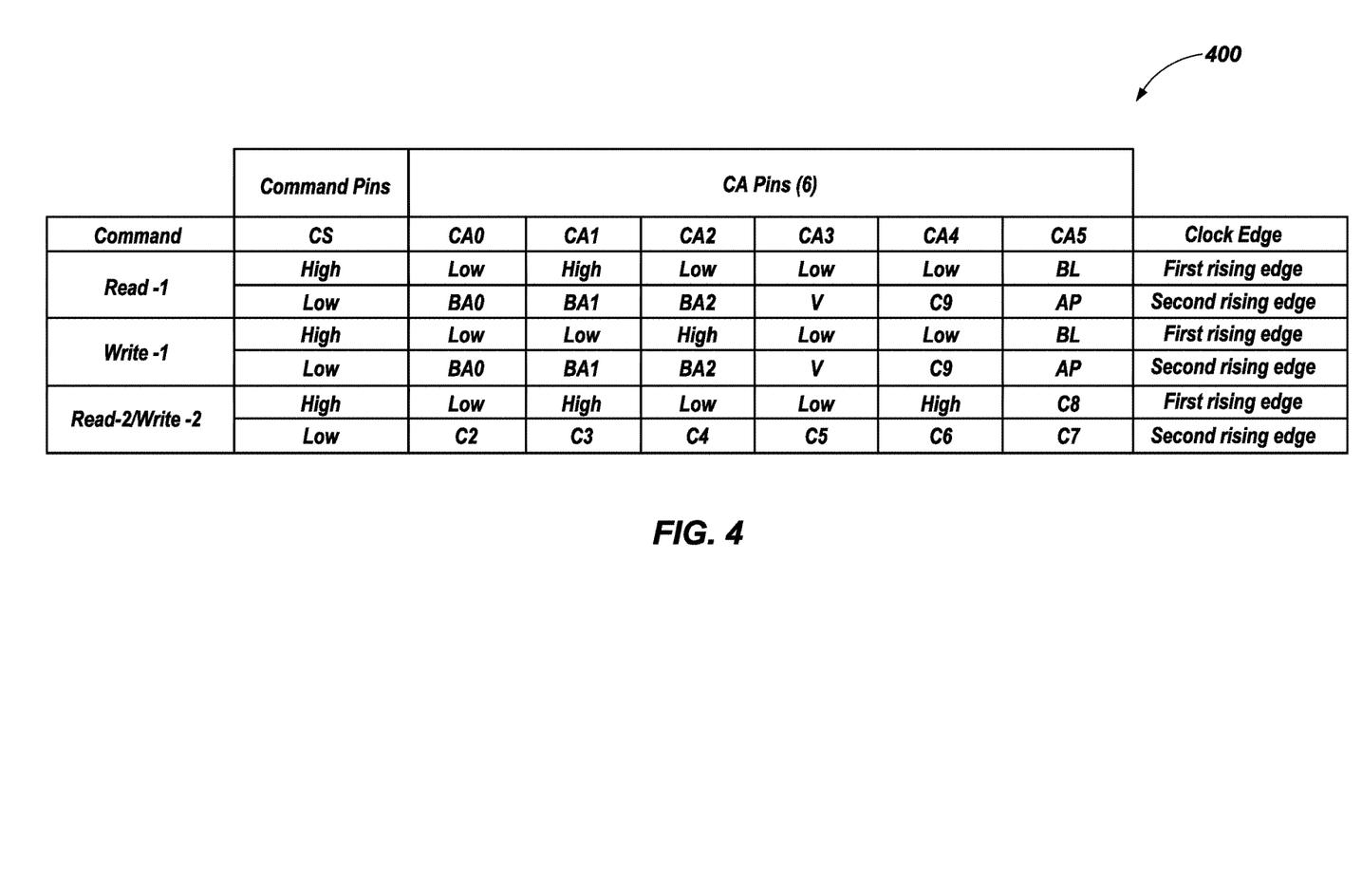
FIG. 4 shows a chart representing various data and command pins of a testing application of a controller according to one or more embodiments of the disclosure.
Figure 5:
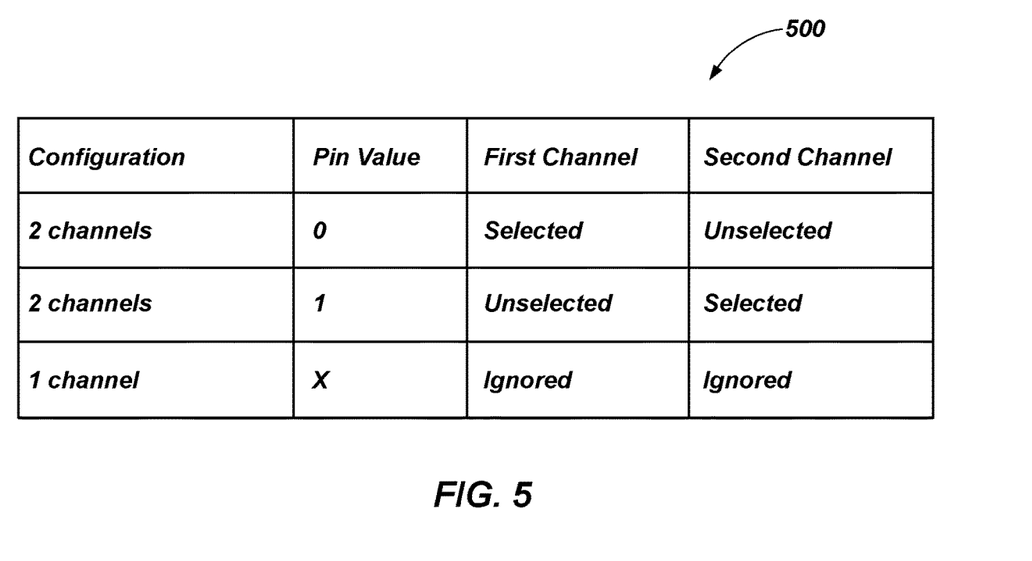
FIG. 5 shows a chart representing channels of a multi-channel die when in a multi-channel configuration and a single channel configuration and potential assigned values of a selected pin according to one or more embodiments of the disclosure.

The method 300 further include selecting a first channel of the multi-channel die 200 for testing, as shown in act 304 of FIG. 3. FIG. 4 shows a chart 400 representing various data and command pins (e.g., input and output pins) of the testing application 103 (e.g., software program) of the controller 102 and assigned values of various pins of the application 103 for read and write commands (i.e., signals) for transmitting to and receiving from the multi-channel die 200. The chart 400 is reflects portions the JEDEC LPDDR4 standard. As shown in the chart 400, read commands may be completed in two cycles, Read-1/Read-2, and write commands may be completed in two cycles, Write-1/Write-2. BA[2:0] determines a bank to be operated upon. C[2:9] determines a column to be operated upon, and C[1:0] are zero. For BL=0, Burst Length is 16, and for BL=1, Burst Length is 32. For AP=0, Auto-Precharge will occur to the bank associated with the Read/Write command. V is an undefined bit. However, in some embodiments, V should have a defined logic level, either High or Low. The V bit may be utilized for the purpose of channel selection, as described herein. As discussed below, the disclosure is not so limited, and any of the CA pins may be selected for interfacing with the channels of a multi-channel die. FIG. 5 shows a chart 500 representing channels of the multi-channel die 200 when in a multi-channel configuration and a single channel configuration and potential assigned values of a pin, which may result in different channels (e.g., a first channel (Channel A) or a second channel (Channel B0)) of the multi-channel die 200 being selected during a testing procedure.

Referring to FIGS. 3-5 together, in some embodiments, selecting a first channel of the multi-channel die 200 for testing may include selecting an input/output pin of the testing application 103 for interfacing with the channels of the multi-channel die 200 via the probe needle 106. As a non-limiting example, and as shown in FIG. 4, selecting a pin may include selecting a Command/Address ("CA") pin (e.g., CA3 pin) of the application 103 for interfacing with the channels of the multi-channel die 200. In some embodiments, selecting a pin may include selecting a bit configuration for interfacing with the channels of the multi-channel die 200. Although pin CA3 is depicted as being selected in FIG. 4, the disclosure is not so limited and any input/output pin of the testing application 103 may be selected for interfacing with the channels of the multi-channel die 200.

Furthermore, selecting a first channel of the multi-channel die 200 for testing may include assigning a first value to the selected pin, as shown in FIG. 5. As a non-limiting example, assigning a first value to the selected pin may include assigning a value of "0" (zero) to the selected pin. In some embodiments, assigning the first value to the selected pin may result in the first channel (e.g., Channel A) of the multi-channel die 200 being selected for testing procedures by the controller 102. In one or more embodiments, the controller 102 may automatically assign the first value to the selected pin in order to select the first channel of the multi-channel die 200. Moreover, although the assigned first value is described as a "0" (zero), the disclosure is not so limited, and any value can be assigned within the functionality of the testing application 103 of the controller 102 that results in a first channel of the multi-channel die 200 being selected.

Figure 6:
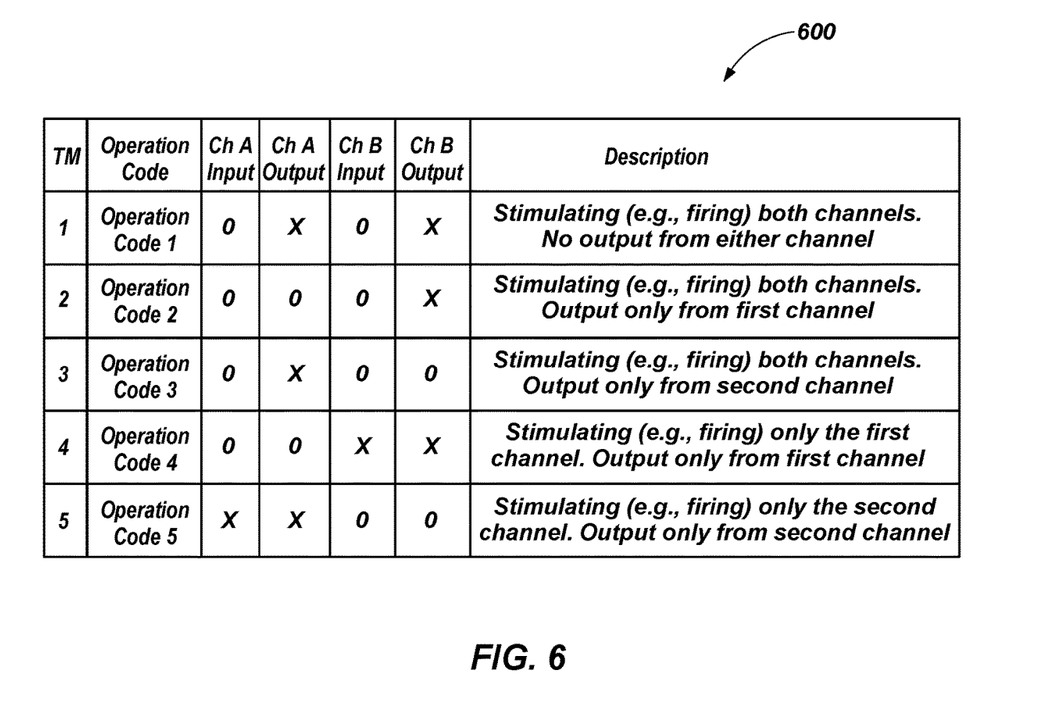
FIG. 6 shows a chart including operation codes that result in different entry and data flows for channels of a multi-channel die.

Upon selecting the first channel of the multi-channel die 200 for testing, the method 300 may include selecting at least one test mode for testing (e.g., validating) the first channel of the multi-channel die 200, as shown in act 306 of FIG. 3. The test mode may define how the multi-channel die 200 is stimulated (e.g., fired) during testing and which output signals are available during the selected test mode. FIG. 6 shows a chart 600 including operation codes that result in different entry and data flows for each of the channels of the multi-channel die 200. Referring to FIGS. 3 and 6 together, in some embodiments, the test modes of the application 103 of the controller 102 include at least five different test modes.

For example, the test modes may include 1) test mode one (i.e., a first test mode) where test signals to both the first and second channels (e.g., Channel A and Channel B) are to be generated and transmitted to multi-channel die 200 (e.g., both the first and second channels are stimulated (e.g., fired)), but an output (e.g., output signals (e.g., data)) will not be received from either of the channels, 2) test mode two (i.e., a second test mode) where both the first and second channels (e.g., Channel A and Channel B) are to be stimulated, but an output will be received only from the first channel (e.g., Channel A), 3) test mode three (i.e., a third test mode) where both the first and second channels (e.g., Channel A and Channel B) are to be stimulated, but an output will be received only from the second channel (e.g., Channel B), 4) test mode four (i.e., a fourth test mode) where only the first channel (e.g., Channel A) is to be stimulated, and an output is received only from the first channel (e.g., Channel A), and 5) test mode five (i.e., a fifth test mode) where only the second channel (e.g., Channel B) is to be stimulated, and an output is received only from the second channel (e.g., Channel B). Stimulation of the first and/or second channels may be achieved via conventional methods and testing signals. In some embodiments, the at least one test mode may be selected based at least partially on an aspect of the multi-channel die 200 being tested. For example, the at least one test mode may be selected to accommodate testing of a chosen aspect of the multi-channel die 200.

While one will appreciate from FIG. 6 that, when testing the first channel, either test mode two or test mode four will be selected in order to achieve outputs from the first channel, for the sake of clarity, scenarios involving test modes two, three, four, and five are described at this point of the disclosure before the full description of selecting the second channel. However, the test modes three and five are also described in further detail in regard to act 314 of the method 300.

As a non-limiting example, the test modes four and five may be selected when either the first channel or the second channel of the multi-channel die are to be tested according to conventional testing methods of a single channel of a die. For instance, upon selecting the first channel as described above in regard to act 304, test mode four may be selected in scenarios where the first channel of the multi-channel die 200 is to be tested according to conventional testing patterns utilized to test a single channel of a die. In some embodiments, the conventional testing patterns may include testing patterns (e.g., structural test patterns and/or functional test patterns) for detecting defects (e.g., non-uniformities, hard defects, symptoms and effects of line width variation, finite dopant distributions, systemic process defects, etc.) and/or determining performance (e.g., speed binning, speed classification, power supply performance, I/O device performance, etc.) of the first channel of the multi-channel die 200. Likewise, as is discussed in greater detail below in regard to act 314, test mode five may be selected to test the second channel of the multi-channel die 200 in the same manner.

Additionally, as another non-limiting example, test modes two and three may be selected for special testing procedures with the multi-channel die 200. In particular, some tests (e.g., validations) require an inherent settling delay after stimulating (e.g., firing) the multi-channel die 200 before an accurate output from the multi-channel die 200 can be measured/read. For example, generally, internal power supplies of the multi-channel die 200 and bias stimulating signals require a longer period of time to stabilize after being stimulated and/or input in comparison to other components of the multi-channel die 200 and stimulating signals. As a result, associated power and power supply tests typically require a wait-time after stimulation before measuring an output from the multi-channel die 200. Thus, as will be discussed in greater detail below, in some embodiments, test modes two and three may be selected when both channels (i.e., the first channel and the second channel) of the multi-channel die 200 will ultimately be tested via testing patterns requiring wait times. As a result, both channels can be stimulated and one channel (e.g., the first channel) can be tested and then, as is discussed in greater detail below, the testing probe system 100 can switch to testing the other channel (e.g., the second channel), which has already been stimulated and requires no additional wait-time before acquiring/reading the output from the other channel.

In view of the foregoing, selecting at least one test mode for testing the first channel of the multi-channel die 200 (act 306) may include selecting at least one of test mode two and test mode four for testing the first channel of the multi-channel die 200. In one or more embodiments, selecting at least one test mode for testing the first channel of the multi-channel die 200 (act 306) may include selecting only one of test mode two or test mode four to perform for testing the first channel of the multi-channel die 200. In additional embodiments, selecting at least one test mode for testing the first channel of the multi-channel die 200 (act 306) may include selecting both test mode two and test mode four to be performed one after another on the multi-channel die 200.

Upon selecting at least one test mode for testing the first channel of the multi-channel die 200, the method 300 may include stimulating (e.g., firing or sending test signals to) at least the first channel of the multi-channel die 200, as shown in act 308 of FIG. 3. For example, the controller 102 may cause at least the first channel of the multi-channel die 200 to be stimulated (e.g., fired) via any of the test patterns described above in regard to act 306 of FIG. 3. When stimulating the first and/or second channels of the multi-channel die 200, the method may include deactivating the additional pads (i.e., unshared pads) of the multi-channel die 200. For example, the testing probe system 100 may deactivate the additional pads (e.g., disconnect the additional pads at the tester).

Responsive to stimulating at least the first channel of the multi-channel die 200, the method 300 may include acquiring (e.g., receiving, measuring, and/or reading) an output of the first channel of the multi-channel die 200, as shown in act 309 of FIG. 3. For example, the controller 102 may acquire (e.g., receive and/or read) an output of the first channel via any conventional method of acquiring/measuring outputs from a channel of multi-channel die 200 and according to the selected test mode.

The method 300 may further include evaluating the first channel (e.g., circuitry, traces, vias, interconnect structures, etc., associated with the first channel) of the multi-channel die 200 based at least partially on the acquired output (e.g., signal and/or data) from the first channel of the multi-channel die 200, as shown in act 310 of FIG. 3. For instance, evaluating the first channel of the multi-channel die 200 may include determining whether the multi-channel die 200 or at least portions of the multi-channel die 200 associated with the first channel include one or more defects based at least in part on the acquired output. In some embodiments, evaluating the first channel of the multi-channel die 200 may include detecting defects, such as, non-uniformities, hard defects, symptoms and effects of line width variation, finite dopant distributions, systemic process defects, etc., based on the acquired output. In some embodiments, evaluating the first channel of the multi-channel die 200 may include assessing performance (e.g., speed binning, speed classification, power supply performance, I/O device performance, etc.) of the first channel of the multi-channel die 200 based on the acquired output. In some embodiments, evaluating the first channel of the multi-channel die 200 may include at least partially determining whether the multi-channel die 200 is a known good die and identifying the multi-channel die 200 as a known good die.

Referring still to FIG. 3, the method 300 may also include, during a same contact period (e.g., a same "touch down") described above in regard to act 302 of FIG. 3, selecting a second channel of the multi-channel die 200 for testing, as shown in act 312 of FIG. 3. In particular, as is described below in regard to the acts 312-320, the method 300 may include selecting and testing the second channel of the multi-channel die 200 during a same contact period (e.g., a same "touch down" on the shared probe pad 202) during which the first channel of the multi-channel die 200 was tested. The contact period may be continuous during testing of both the first channel and the second channel of the multi-channel die 200.

Referring to FIGS. 3-5 together, in some embodiments, selecting a second channel of the multi-channel die 200 for testing may include selecting an input/output pin of the testing application 103 of the controller 102 for interfacing with the channels of the multi-channel die 200 via the probe needle 106 of the testing probe system 100. As a non-limiting example, and as shown in FIG. 4, selecting a pin may include selecting the Command/Address ("CA") pin (e.g., CA3 pin) of the testing application 103 that was selected for testing the first channel of the multi-channel die 200.

Furthermore, selecting the second channel of the multi-channel die 200 for testing may include assigning a second value to the selected pin, as shown in FIG. 5. As a non-limiting example, assigning a second value to the selected pin may include assigning a value of "1" (one) to the selected pin. In one or more embodiments, assigning the second value to the selected pin may include changing a previously assigned value (e.g., a value assigned when selecting the first channel). In some embodiments, assigning the second value to the selected pin may result in the second channel (e.g., Channel B) of the multi-channel die 200 being selected by the controller 102. In one or more embodiments, the controller 102 may automatically assign the second value to the selected pin in order to select the second channel of the multi-channel die 200. Moreover, as mentioned briefly before, although the assigned second value is described as a "1" (one), the disclosure is not so limited, and any value can be assigned within the functionality of the testing application 103 of the controller 102 that results in the second channel of the multi-channel die 200 being selected.

Upon selecting the second channel of the multi-channel die 200 for testing, the method 300 may include selecting at least one test mode for testing (e.g., validating) the second channel of the multi-channel die 200, as shown in act 314 of FIG. 3. As discussed above, the test mode may define how the multi-channel die 200 is stimulated (e.g., fired) during testing and which outputs (e.g., output signals) are made available during the selected test mode.

Referring to FIGS. 3 and 6 together, selecting at least test mode for testing (e.g., validating) the second channel of the multi-channel die 200 may include selecting at least one of test mode three and test mode five for testing the second channel of the multi-channel die 200. The test modes may be chosen and selected according to any of the criteria (e.g., aspects of the second channel to be tested) discussed above in regard to act 306 of FIG. 3. In one or more embodiments, selecting at least one test mode for testing the second channel of the multi-channel die 200 (act 314) may include selecting only one of test mode three or test mode five to perform for testing the second channel of the multi-channel die 200. In additional embodiments, selecting at least one test mode for testing the second channel of the multi-channel die 200 (act 314) may include selecting both test mode three and test mode five to be performed one after another on the multi-channel die 200.

Upon selecting at least one test mode for testing the second channel of the multi-channel die 200, the method 300 may include stimulating (e.g., firing or sending test signals to) at least the second channel of the multi-channel die 200, as shown in act 316 of FIG. 3. For example, the controller 102 may cause at least the second channel of the multi-channel die 200 to be stimulated (e.g., fired) via any of the test patterns described above in regard to acts 306 and 314 of FIG. 3. The second channel of the multi-channel die 200 may be stimulated during a same contact period between the probe needle 106 and the shared probe pad 202 (e.g., a same "touch-down") during which the first channel of the multi-channel die 200 was stimulated. As noted above, when stimulating the first and/or second channels of the multi-channel die 200, the method may include deactivating the additional pads (i.e., unshared pads) of the multi-channel die 200. For example, the testing probe system 100 may deactivate the additional pads (e.g., disconnect the additional pads at the tester).

In additional embodiments, the method 300 may not include stimulating the second channel upon selecting at least one test mode for acquiring an output from the second channel of the multi-channel die 200. For instance, the method 300 may rely at least partially upon a previous stimulation of the second channel during act 308 of FIG. 3. As a result, in some instances, the method 300 does not include stimulating the second channel of the multi-channel die 200 in a separate act from stimulating the first channel of the multi-channel die 200.

Responsive to stimulating at least the second channel of the multi-channel die 200, either via act 316 or act 308 of FIG. 3, the method 300 may include acquiring (e.g., receiving, measuring, and/or reading) an output of the second channel of the multi-channel die 200, as shown in act 318 of FIG. 3. For example, the controller 102 may acquire (e.g., receive and/or read) an output of the second channel via any conventional method of acquiring/measuring outputs from a channel of multi-channel die 200 and according to the selected test mode. The output of the second channel of the multi-channel die 200 may be acquired during a same contact period between the probe needle 106 and the shared probe pad 202 (e.g., a same "touch-down") during which the output of the first channel of the multi-channel die 200 was acquired.

The method 300 may further include evaluating the second channel (e.g., circuitry, traces, vias, interconnect structures, etc., associated with the second channel) of the multi-channel die 200 based at least partially on the acquired output (e.g., signal and/or data) from the second channel of the multi-channel die 200, as shown in act 320 of FIG. 3. For instance, evaluating the second channel of the multi-channel die 200 may include determining whether the multi-channel die 200 or at least portions of the multi-channel die 200 associated with the second channel include one or more defects based at least in part on the acquired output. In some embodiments, evaluating the second channel of the multi-channel die 200 may include detecting defects, such as, non-uniformities, hard defects, symptoms and effects of line width variation, finite dopant distributions, systemic process defects, etc., based on the acquired output. In some embodiments, evaluating the second channel of the multi-channel die 200 may include assessing performance (e.g., speed binning, speed classification, power supply performance, I/O device performance, etc.) of the second channel of the multi-channel die 200 based on the acquired output.

In some embodiments, evaluating the second channel of the multi-channel die 200 may include at least partially determining whether the multi-channel die 200 is a KGD (e.g., free of significant defects) and identifying the multi-channel die 200 as a KGD. Furthermore, evaluating both the first and second channels of the multi-channel die 200 may include determining whether the multi-channel die 200 is a KGD (e.g., free of significant defects) and identifying the multi-channel die 200 as a KGD. The identification of the multi-channel die 200 as a KGD may be utilized in later sorting processes.

Referring to acts 308, 310, 318 and 320 of FIG. 3 together, as referenced above, in some embodiments, during act 308, the method 300 may include stimulating both the first channel and the second channel simultaneously when wait-times are required prior to acquiring an output from the first channel and/or the second channel. In such embodiments, the method 300 may include stimulating both the first channel and second channel simultaneously via test mode two of FIG. 6, waiting a required wait-time, acquiring the output of the first channel, immediately switching to testing the second channel (e.g., selecting the second channel via act 312 of FIG. 3), and acquiring the output of the second channel. Furthermore, the foregoing process may be performed without breaking contact (e.g., a "touch down") between the probe needle 106 and the shared probe pad 202. In additional embodiments, the method 300 may include stimulating both the first channel and second channel simultaneously via test mode two, immediately acquiring the output of the first channel, waiting a required wait-time, switching to testing the second channel (e.g., selecting the second channel via act 312 of FIG. 3), and acquiring the output of the second channel. Furthermore, the foregoing process may be performed without breaking contact (e.g., a "touch down") between the probe needle 106 and the shared probe pad 202. In view of the foregoing, the method 300 requires only a single contact period (e.g., a single "touch down") between the probe needle 106 and the shared probe pad 202 of the multi-channel die 200.

In one or more embodiments, one or more acts of method 300 may be repeated. For instance, the method 300 may include switching back and forth between testing the first channel and the second channel of the multi-channel die 200 via any of the methods described herein. As a non-limiting example, the method 300 may include testing a first aspect of the first channel of the multi-channel die 200 via any of acts 304-310, switching and testing the same or different aspect of the second channel of the multi-channel die 200 via any of acts 312-320, and the returning to testing another aspect of the first channel of multi-channel die 200 via any of acts 304-310. For instance, the method 300 may include any number of switches between testing the first and second channels required to test any number of aspects of the first and second channels of the multi-channel die 200 during a single contact period between the probe needle 106 and the shared probe pad 202 of the multi-channel die 200.

In some embodiments, one or more of the acts of the method 300 may occur outside of a contact period (e.g., a "touch down") between the probe needle 106 and the shared probe pad 202. For instance, one or more of acts 304, 306, 310, and 320 may occur when the probe needle 106 is not contact the shared probe pad 202 (e.g., before or after the single contact period).

In one or more embodiments, the method 300 may further include grading and sorting die based on whether channels of the multi-channel die 200 include defects.

Referring to FIGS. 1-6 together, the testing probe system 100 and the multi-channel die 200 of the disclosure may provide advantages over conventional testing probe system and dies. For instance, because the multi-channel die 200 includes shared probe pads 202, and because the testing probe system 100 can switch between testing first and second channels of the multi-channel die 200 during a single contact period ("touch-down") with the shared probe pads 202, the combination of the testing probe system 100 and the multi-channel die 200 of the disclosure may reduce an amount of time required to test the first channel and the second channel of a given die in comparison to conventional multi-channel die and testing probe systems, which require separate contact periods ("touch-downs") for each channel of the multi-channel die being tested. For instance, the combination of the testing probe system 100 and the multi-channel die 200 of the disclosure may reduce an amount of time required to test both the first channel and the second channel by at least half.

By reducing the amount of time required to test both the first and second channels of the multi-channel die 200, the combination of the testing probe system 100 and multi-channel die 200 of the disclosure may reduce an amount of time required to test an entire wafer, which may decrease production time and may increase overall production. Increasing overall production may lead to increased sales and revenue.

Furthermore, reducing a number of contact periods between the probe needles 106 and the shared probe pads 202, the combination of the testing probe system 100 and the multi-channel die 200 of the disclosure may reduce a likelihood that the multi-channel die 200 and other multi-channel die of a wafer are damaged during testing. Reducing the likelihood that dies are damaged during testing may increase a yield of good die per wafer, which may increase efficiency, sales, and revenue.

Moreover, the combination of the testing probe system 100 and the multi-channel die 200 may be implemented without requiring physical modification of a given testing probe system. For instance, conventional needle probes and conventional needle probe orientations may be utilized because the orientation of the shared probe pads may be determined/formed based on a pattern of conventional needles probes of a given testing probe system. Furthermore, additional needle probes beyond conventional numbers are unnecessary to implement to methods described herein.

Figure 7:
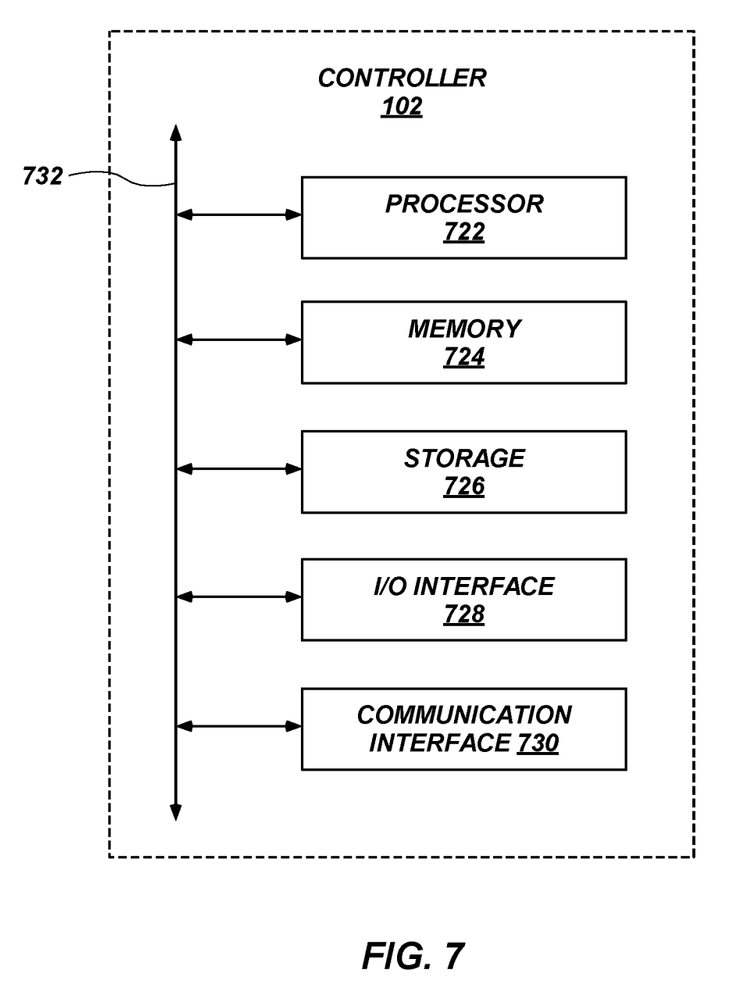
FIG. 7 shows a block diagram of an example controller of a testing probe system according to one or more embodiments of the present disclosure.

FIG. 7 illustrates a block diagram of an example controller 102 that may be configured to perform one or more of the processes described above. One will appreciate that one or more computing devices may form the controller 102 of the testing probe system 100. As shown by FIG. 7, the controller 102 can comprise a processor 722, a memory 724, a storage device 726, an I/O interface 728, and a communication interface 730, which may be communicatively coupled by way of a communication infrastructure. While an example controller 102 is shown in FIG. 7, the components illustrated in FIG. 7 are not intended to be limiting. Additional or alternative components may be used in other embodiments. Furthermore, in certain embodiments, the controller 102 can include fewer components than those shown in FIG. 7. Components of the controller 102 shown in FIG. 7 will now be described in additional detail.

In one or more embodiments, the processor 722 includes hardware for executing instructions, such as those making up a computer program. As an example, and not by way of limitation, to execute instructions, the processor 722 may retrieve (or fetch) the instructions from an internal register, an internal cache, the memory 724, or the storage device 726 and decode and execute them. In one or more embodiments, the processor 722 may include one or more internal caches for data, instructions, or addresses. As an example, and not by way of limitation, the processor 722 may include one or more instruction caches, one or more data caches, and one or more translation look aside buffers (TLBs). Instructions in the instruction caches may be copies of instructions in the memory 724 or the storage device 726.

The controller 102 includes memory 724, which is coupled to the processor(s) 722. The memory 724 may be used for storing data, metadata, and programs for execution by the processor(s). The memory 724 may include one or more of volatile and non-volatile memories, such as Random-Access Memory ("RAM"), Read-Only Memory ("ROM"), a solid state disk ("SSD"), Flash, Phase Change Memory ("PCM"), or other types of data storage. The memory 724 may be internal or distributed memory.

The controller 102 includes a storage device 726 that includes storage for storing data or instructions. As an example, and not by way of limitation, storage device 726 can comprise a non-transitory storage medium described above. The storage device 726 may include a hard disk drive (HDD), a floppy disk drive, Flash memory, an optical disc, a magneto-optical disc, magnetic tape, or a Universal Serial Bus (USB) drive or a combination of two or more of these. The storage device 726 may include removable or non-removable (or fixed) media, where appropriate. The storage device 726 may be internal or external to the controller 102. In one or more embodiments, the storage device 726 is non-volatile, solid-state memory. In other embodiments, the storage device 726 includes read-only memory (ROM). Where appropriate, this ROM may be mask programmed ROM, programmable ROM (PROM), erasable PROM (EPROM), electrically erasable PROM (EEPROM), electrically alterable ROM (EAROM), or Flash memory or a combination of two or more of these.

The controller 102 also includes one or more input or output ("I/O") devices/interfaces 728 (e.g., a touch display), which are provided to allow a user to provide input to, receive output from, and otherwise transfer data to and receive data from controller 102. The I/O devices/interfaces 728 may include a mouse, a keypad or a keyboard, a touch screen, a camera, an optical scanner, network interface, modem, other known I/O devices or a combination of such I/O device/interfaces. The touch screen may be activated with a stylus or a finger.

The I/O devices/interfaces 728 may include one or more devices for presenting output to a user, including, but not limited to, a graphics engine, a display (e.g., a display screen), one or more output drivers (e.g., display drivers), one or more audio speakers, and one or more audio drivers. In certain embodiments, the I/O interface 728 is configured to provide graphical data to a display for presentation to a user. The graphical data may be representative of one or more graphical user interfaces and/or any other graphical content as may serve a particular implementation.

The controller 102 can further include a communication interface 730. The communication interface 730 can include hardware, software, or both. The communication interface 730 can provide one or more interfaces for communication (such as, for example, packet-based communication) between the controller 102 and one or more other computing devices or networks. As an example, and not by way of limitation, the communication interface 730 may include a network interface controller (NIC) or network adapter for communicating with an Ethernet or other wire-based network or a wireless NIC (WNIC) or wireless adapter for communicating with a wireless network, such as a WI-FI and/or Bluetooth. The controller 102 can further include a bus 732. The bus 732 can comprise hardware, software, or both that couples components of controller 102 to each other.

Embodiments of the disclosure include a testing probe system. The testing probe system including: probes configured to contact shared probe pads of multi-channel die of a wafer and a controller configured to generate testing patterns and receive signals from the multi-channel die of the wafer. The controller includes at least one processor and at least one non-transitory computer-readable storage medium storing instructions thereon that, when executed by the at least one processor, cause the testing probe system to: contact a probe of the probes with a shared probe pad of the multi-channel die, select a first channel of the multi-channel die to test, select at least one test mode for testing the first channel of the multi-channel die, stimulate at least the first channel of the multi-channel die during a single continuous contact period; acquire a first output of the first channel of the multi-channel die during the single continuous contact period, select a second channel of the multi-channel die to test, select at least one test mode for testing the second channel of the multi-channel die, stimulate at least the second channel of the multi-channel die during the single continuous contact period, and acquire a second output of the second channel of the multi-channel die during the single continuous contact period.

One or more embodiments of the disclosure include a multi-channel die. The multi-channel die may include a semiconductor material and shared probe pads on an upper surface of the semiconductor material and operably coupled to both a first channel and a second channel of the multi-channel die.

Some embodiments of the disclosure include a method of testing at least one die. The method may include selecting a first channel of a multi-channel die to test, selecting at least one test mode for testing the first channel of the multi-channel die, and contacting a probe of a testing probe system with the multi-channel die to initiate a single contact period, and during the single contact period: stimulating at least the first channel of the multi-channel die, acquiring a first output of the first channel of the multi-channel die, selecting a second channel of the multi-channel die to test, selecting at least one test mode for testing the second channel of the multi-channel die, stimulating at least the second channel of the multi-channel die, and acquiring a second output of the second channel of the multi-channel die.

Embodiments of the disclosure include a testing probe system. The testing probe system may include probes configured for contacting shared probe pads of multi-channel die of a wafer and a controller configured for generating testing patterns and receiving signals from the multi-channel die of the wafer. The controller may include a processor and a non-transitory computer-readable storage medium storing instructions thereon that, when executed by the processor, effectuate contact of a probe of the probes with a shared probe pad of the multi-channel die to: initiate a single contact period and, during the single contact period, test functionalities of at least two channels of the multi-channel die.

While the disclosure has been described herein with respect to certain illustrated embodiments, those of ordinary skill in the art will recognize and appreciate that it is not so limited. Rather, many additions, deletions, and modifications to the illustrated embodiments may be made without departing from the scope of the invention as claimed, including legal equivalents thereof. In addition, features from one embodiment may be combined with features of another embodiment while still being encompassed within the scope of the disclosure as contemplated by the inventors. Further, embodiments of the disclosure have utility with different and various tool types and configurations.

What is claimed is:

1. A testing probe system, comprising:
   probes configured to contact shared probe pads of a multi-channel die of a wafer; and
   a controller configured to generate testing patterns and receive signals from the multi-channel die of the wafer, the controller comprising:
   at least one processor; and
   at least one non-transitory computer-readable storage medium storing instructions thereon that, when executed by the at least one processor, cause the testing probe system to:
   contact a probe of the probes with a shared probe pad of the multi-channel die to initiate a single continuous contact period between the probe and the shared probe pad;
   select a first channel of the multi-channel die to test;
   select at least one test mode for testing the first channel of the multi-channel die;
   stimulate at least the first channel of the multi-channel die via the shared probe pad and during the single continuous contact period;
   acquire a first output of the first channel of the multi-channel die via the shared probe pad and during the single continuous contact period;
   select a second channel of the multi-channel die to test;
   select at least one test mode for testing the second channel of the multi-channel die;
   stimulate at least the second channel of the multi-channel die via the shared probe pad and during the single continuous contact period; and
   acquire a second output of the second channel of the multi-channel die via the shared probe pad and during the single continuous contact period.

2. The testing probe system of claim 1, further comprising instructions that, when executed by the at least one processor, cause the testing probe system to:
   evaluate a functionality of the first channel of the multi-channel die based at least partially on the acquired first output; and
   evaluate a functionality of the second channel of the multi-channel die based at least partially on the acquired second output.

3. The testing probe system of claim 1, wherein selecting the first channel comprises assigning a first value to a pin of an application of the controller.

4. The testing probe system of claim 3, wherein selecting the second channel comprises assigning a second value to a pin of an application of the controller.

5. The testing probe system of claim 1, wherein selecting at least one test mode for testing the first channel comprises selecting at least one of a mode for stimulating both the first channel and the second channel and receiving an output only from the first channel or another mode for stimulating only the first channel and receiving an output from only the first channel of the multi-channel die.

6. The testing probe system of claim 1, wherein selecting at least one test mode for testing the second channel comprises selecting at least one of a mode for stimulating both the second channel and the first channel and receiving an output only from the second channel or another mode for stimulating only the second channel and receiving an output from only the second channel of the multi-channel die.

7. The testing probe system of claim 1, wherein stimulating at least the first channel of the multi-channel die comprises stimulating both the first channel and the second channel.

8. The testing probe system of claim 1, wherein stimulating at least the second channel of the multi-channel die comprises stimulating the second channel at a same time as stimulating the first channel.

9. The testing probe system of claim 1, further comprising instructions that, when executed by the at least one processor, cause the testing probe system to deactivate additional probe pads dedicated to a single channel of the first channel and the second channel of the multi-channel die.

10. A multi-channel die, comprising:
    a semiconductor material;
    first native probe pads on an upper surface of the semiconductor material and operably coupled to a first channel of the multi-channel die;
    second native probe pads on the upper surface of the semiconductor material and operably coupled to a second channel of the multi-channel die distinct from the first channel of the multi-channel die; and
    shared probe pads on the upper surface of the semiconductor material between the first native probes pads and the second native probe pads and operably coupled to both the first channel and the second channel of the multi-channel die, wherein each first native probe pad and each second native probe pad is connected to a respective shared probe pad of the shared probe pads.

11. The multi-channel die of claim 10, wherein each of the shared probe pad is operably connected to both a respective first native probe pad and a respective second native probe pad.

12. The multi-channel die of claim 10, wherein the shared probe pads are positioned within a center region of the upper surface of the semiconductor material.

13. The multi-channel die of claim 12, wherein the shared probe pads are centered between two opposing lateral sides of the multi-channel die.

14. The multi-channel die of claim 13, wherein each of the shared probe pad is centered between a respective first native probe pad and a respective second native probe pad.

15. The multi-channel die of claim 14, wherein an orientation of the shared probe pads relative to one another substantially match an orientation of the first native probe pads relative to one another.

16. A method of testing at least one multi-channel die, the method comprising:
    selecting a first channel of a multi-channel die to test;
    selecting at least one test mode for testing the first channel of the multi-channel die; and
    contacting a probe of a testing probe system with a shared probe pad of the multi-channel die to initiate a single continuous contact period, and during the single continuous contact period:
        stimulating at least the first channel of the multi-channel die via the shared probe pad;
        acquiring a first output of the first channel of the multi-channel die via the shared probe pad;
        selecting a second channel of the multi-channel die to test;
        selecting at least one test mode for testing the second channel of the multi-channel die;
        stimulating at least the second channel of the multi-channel die via the shared probe pad; and
        acquiring a second output of the second channel of the multi-channel die via the shared probe pad.

17. The method of claim 16, further comprising, during the single contact period, switching back and forth at least once between stimulating and acquiring output from the first channel and the second channel of the multi-channel die.

18. The method of claim 16, further comprising:
    evaluating a functionality of the first channel of the multi-channel die based at least partially on the acquired first output; and
    evaluating a functionality of the second channel of the multi-channel die based at least partially on the acquired second output.

19. The method of claim 16, further comprising:
    responsive to selecting the multi-channel die to test, stimulating the first channel and the second channel simultaneously;
    acquiring the first output of the first channel of the multi-channel die;
    selecting the second channel of the multi-channel die to test; and
    acquiring the second output of the second channel of the multi-channel die without separately stimulating the second channel a second time.

20. The method of claim 16, wherein selecting the first channel comprises assigning a first value to a pin of an application of a controller of the testing probe system.

21. The method of claim 20, wherein selecting the second channel comprises assigning a second value to a pin of an application of a controller of the testing probe system.

22. The method of claim 16, wherein selecting at least one test mode for testing the first channel comprises selecting at least one of a mode for stimulating both the first channel and the second channel and receiving an output only from the first channel or another mode for stimulating only the first channel and receiving an output from only the first channel of the multi-channel die.

23. The method of claim 16, wherein selecting at least one test mode for testing the second channel comprises selecting one or more of a first mode for stimulating both the second channel and the first channel and receiving an output only from the second channel and a second mode for stimulating only the second channel and receiving an output from only the second channel of the multi-channel die.

24. A testing probe system, comprising:
    probes configured for contacting shared probe pads of multi-channel die of a wafer; and
    a controller configured for generating testing patterns and receiving signals from the multi-channel die of the wafer, the controller comprising:
        a processor; and
        a non-transitory computer-readable storage medium storing instructions thereon that, when executed by the processor, effectuate contact of a probe of the probes with a shared probe pad of the multi-channel die to:
            initiate a single contact period; and
            during the single contact period, stimulate at least two channels of the multi-channel die and acquire outputs from each of the at least two channels of the multi-channel die via the same probe and same shared probe pad.

25. The testing probe system of claim 24, further comprising instruction that, when executed by the processor, effectuate deactivation of additional probe pads dedicated to a single channel of the at least two channels of the multi-channel die.

* * * * *